United States Patent
Cook et al.

(10) Patent No.: US 6,888,388 B1
(45) Date of Patent: May 3, 2005

(54) CONSTANT EDGE RATE OUTPUT DRIVER

(75) Inventors: Richard W. Cook, N. Waterbore, ME (US); Steven M. Macaluso, Scarborough, ME (US)

(73) Assignee: National Semiconductor Corp., Santa Clara, CA (US)

( * ) Notice: Subject to any disclaimer, the term of this patent is extended or adjusted under 35 U.S.C. 154(b) by 105 days.

(21) Appl. No.: 10/435,277

(22) Filed: May 8, 2003

(51) Int. Cl.[7] .............................. H03B 1/00; H03K 3/00
(52) U.S. Cl. ........................ 327/170; 327/108; 326/83; 326/86
(58) Field of Search ................................. 327/170, 108, 327/112; 326/26, 27, 30, 82, 83, 86

(56) References Cited

U.S. PATENT DOCUMENTS

| | | | | |
|---|---|---|---|---|
| 6,054,874 A | * | 4/2000 | Sculley et al. ................. | 326/83 |
| 6,064,224 A | * | 5/2000 | Esch et al. ..................... | 326/30 |
| 6,111,431 A | * | 8/2000 | Estrada ......................... | 326/83 |
| 6,288,563 B1 | * | 9/2001 | Muljono et al. .............. | 326/27 |
| 6,300,806 B1 | * | 10/2001 | Theus et al. ................. | 327/112 |
| 6,380,797 B1 | * | 4/2002 | Macaluso et al. ........... | 327/513 |
| 6,414,525 B2 | * | 7/2002 | Urakawa ..................... | 327/112 |
| 6,509,756 B1 | * | 1/2003 | Yu et al. ....................... | 326/30 |

* cited by examiner

Primary Examiner—Tuan T. Lam
(74) Attorney, Agent, or Firm—Jurgen Vollrath

(57) ABSTRACT

In a circuit and method for adjusting rise-and-fall-time changes in an output driver signal due to changes in temperature, process or voltage, the driver output voltage is monitored and current flow through a constant load resistor adjusted as the voltage changes. The current may be adjusted by controlling the gate-source voltage on a transistor. The gate voltage on the transistor may also be used to adjust the power supply to pre-drivers of the output driver.

12 Claims, 5 Drawing Sheets

CONSTANT EDGE RATE OUTPUT DRIVER

BACKGROUND OF THE INVENTION

An ideal output driver circuit will provide a fairly constant output signal with rise and fall times remaining pretty much unchanged. However, in practice, there will be process, voltage, and temperature variations, which will impact the output signal characteristics. In other words, the rise and fall times of the signal will change due to changes in manufacturing and environment.

The present application seeks to provide a solution to avoid such variations in the output edge rate due to process, voltage and temperature (PVT) variations.

SUMMARY OF THE INVENTION

The invention provides feedback to pre-drivers to adjust the rise and fall times of the output signal as these vary with PVT. In particular, the present invention monitors changes in the rise or fall times of the output signal and adjusts the power supply to the one or more pre-drivers.

According to the invention, variations in the rise/fall time of an output driver circuit signal due to process, voltage or temperature variations, are compensated for by determining a function of current flow change with rise/fall time variation, and providing a circuit that supplies a voltage or current that changes in sympathy with the current flow change due to rise/fall time variations. In one embodiment, variations in current flow are monitored by observing the gate-source voltage of a PMOS transistor through which the current flows and determining the function of gate-source voltage against rise/fall time of an output driver circuit signal due to process, voltage or temperature variations. The compensation circuit that generates a feedback voltage or current may include the PMOS transistor, wherein the gate voltage is used as a control signal. The voltage or current from the compensation circuit is typically used as feedback to compensate for variations in the rise/fall time. The feedback may be used to adjust the power supply to one or more pre-drivers of the output driver. The control circuit may further include a pseudo-rail for generating one or more power references. The signal being controlled may be a low voltage differential signal (LVDS). The pseudo rail may generate a high and a lower voltage reference for adjusting the rise and fall times, respectively, of the differential signal.

DETAILED DESCRIPTION OF THE INVENTION

The invennton will be described with reference to a low voltage differential signal (LVDS). However, it will be appreciated that the concepts of the invention are eqully applicable to other signals for purposes of maintaining a constant rise/fall time in spite of process, voltage, and temperature (PVT) variations.

Figure 1:
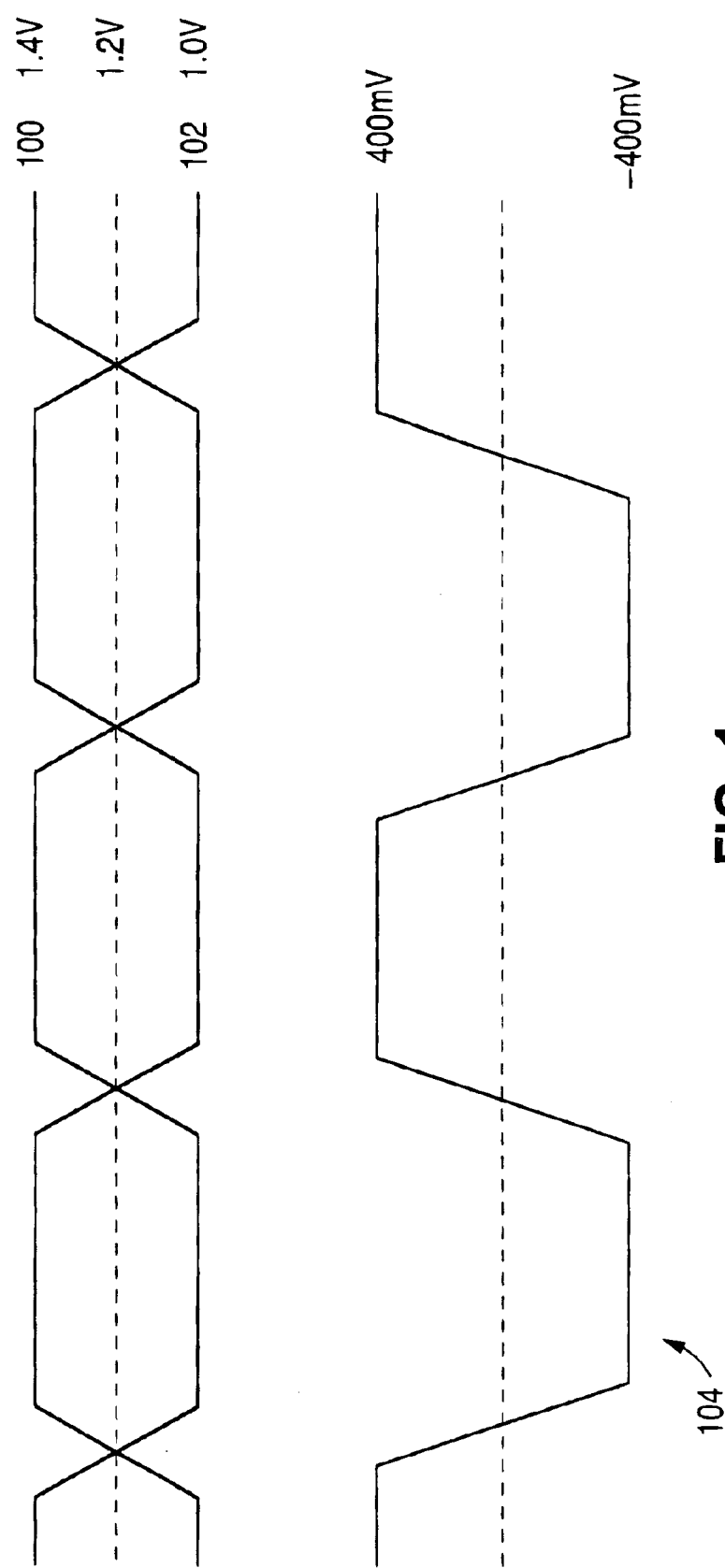
FIG. 1 shows a typical signal and its inverse, and a differential signal derived from the signal and inverse, to define a low voltage differential signal (LVDS)

Since the embodiment discussed below deals specifically with a LVDS, a brief discussion is included about LVDS. FIG. 1 shows a typical input signal 100, and its inverse 102, which, when subtracted, one from the other, results in a differential signal 104. The input signal 100 is offset by 1.2 V and has a low voltage of 1.0 V and a high voltage of 1.4 V in this example. When subtracted from its inverse signal 102, the resultant signal varies between –400 mV and +400 mV to provider a power efficient signal that has short rise and fall times due to the low maximum and minimum signal voltages. It also has a zero crossing point.

Figure 2:
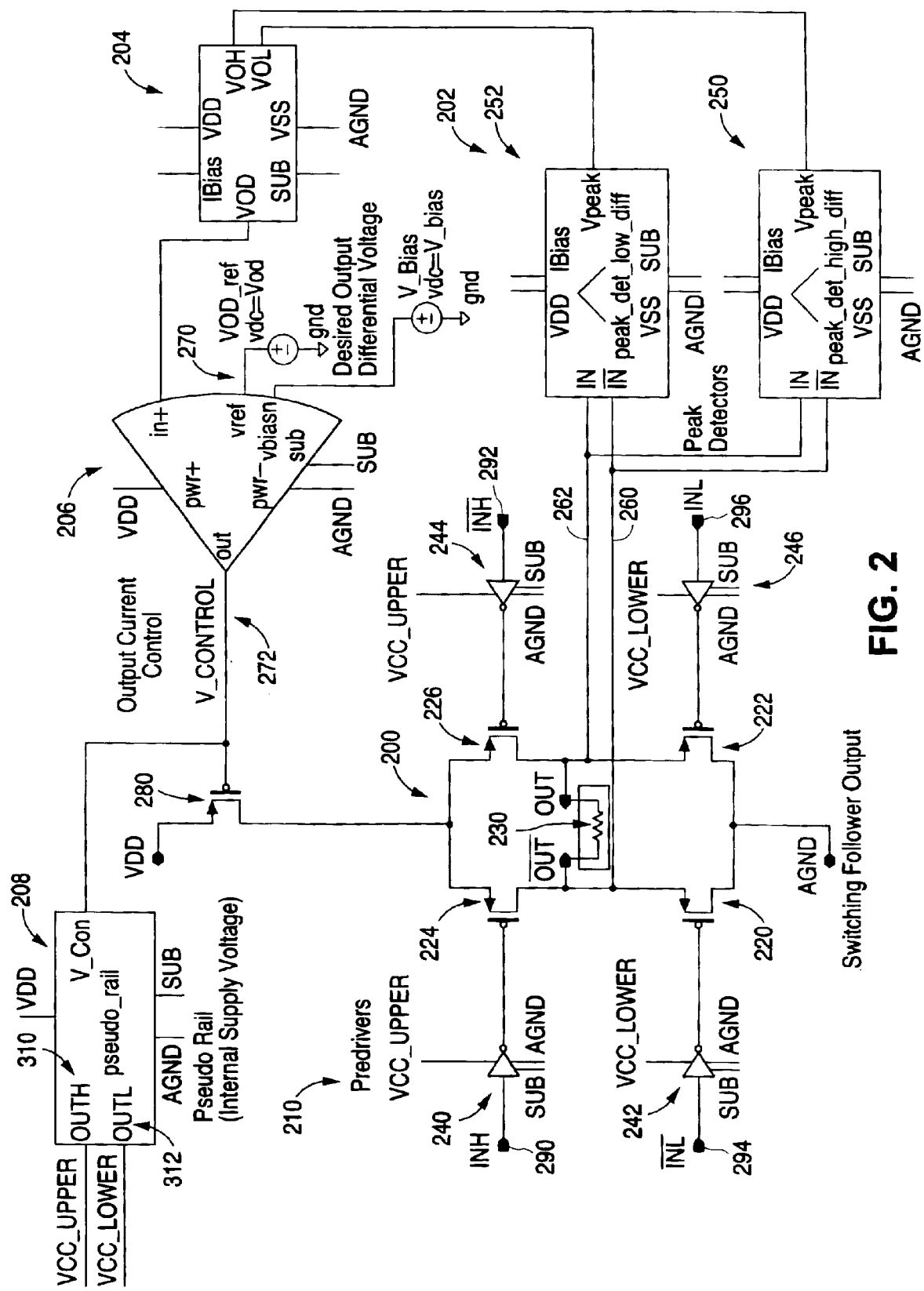
FIG. 2 is a schematic circuit diagram of one embodiment of the invention.

FIG. 2 shows one embodiment of the invention, in which a LVDS driver uses freedback to maintain substantially a constant rise/fall time of the LVDS with changes in PVT.

The circuit of FIG. 2 is made up of six sections: the driver or switching follower 200, peak detector circuitry 202, a subtraction circuit 204, comparator circuit 206, pseudo-rail 208, and predriver 210.

The switching follower 200 comprises two follower transistors 220, 222, that are biased to operate in saturation, and two switching transistors 224, 226, which switch on in alternating fashion to steer current through the load 230 and then through one of the followers, respectively. In particular, when switching transistor 224 is on, current is steered through the load 230 and follower 222. Thus in any one transition, current is steered through one switch, the load 230, and one follower, thereby providing for very low power consumption due to the input signal and its inverse steering all of the current through the load 230 to achieve the differential signal discussed above with respect to FIG. 1.

The input signals INH 290 and its inverse 292 control the gates of switching transistors 224, 226 to ensure proper switching. The input signals INL 294 and its inverse 296 control the gates of followers 220, 222, to ensure that the followers operate in saturation. The signals INH 290 and INL 294 are essentially identical but may differ in magnitude relative to each other by a certain voltage as defined by the power supplies VCC_UPPER and VCC_LOWER. Thus, it will be appreciated that by changing the power supply VCC_UPPER the switching of switching transistor 224 can be controlled. Since pre-driver inverter 244 is also supplied by VCC_UPPER, it will, in turn, control the inverted INH signal by controlling the gate of switching transistor 226.

It will be appreciated that, for the driver 200 to operate properly, only one of the switches and one of the followers would conduct current at any one time. Thus the input signal INH 290 would switch transistor 224 on during a high signal, and the inverse signal 292 would switch transistor 226 off, since it would provide a low signal that is inverted by inverter 244 to pull the gate of transistor 226 up. Thus transistor 224 would switch on after a certain rise time and transistor 226 would turn off. Thus current would start flowing from left to right through the load 230 in FIG. 2 to provide a high voltage on line 260, and a low on line 262. The opposite happens when the input signal INH is low. (It should be noted that that H and L in INH and INL merely represent the high and low locations of the transistors in FIG. 2. H is the higher transistor and L the lower transistor. Similarly OUT and its inverse are arbitrary designations). Thus it will be appreciated that changing the power supply to the inverters 240, 244 will change how hard the transistors 224, 226 turn on and off and will therefore effect the edge rate of the signals on lines 260, 262.

Any variations in the rise/fall time of the differential signal can be compensated by controlling the turn on time of transistors 224, 226, 220, 222. The relationship between the voltage level across the gate and source of transistor 280 and the rise/fall time of the differential signal is best understood with reference to FIG. 1. The input signals 100, 102, define the differential signal 104. If the high of input signal 100 were to increase from 1.4 V to 1.5 V, and the inverted signal were, in turn, to have a low of 0.9 V due to changes in PVT, the resultant differential signal would vary between −600 mV and +600 mV. The present invention, however, would not allow this to happen because, as is discussed in further detail below (refer to FIG. 2), the peak detector would adjust the gate voltage of transistor 280, which would change the current and thus move the differential voltage back to −400 mV and +400 mV. Thus the change in the gate voltage of the transistor 280 is monitored and subsequently fed to the pseudo rails 208 to control the predrivers, which in turn controls the edge rate.

The signals across the load 230 are fed into the peak detector circuit 202, which comprises a high peak detector 250 and a low peak detector 252 (which are commonly known in the art) to extract the maximum and minimum signal values on the two lines 260, 262. These maximum and minimum values are fed into the subtraction circuit 204 to determine the voltage difference. For instance, with reference to FIG. 1, 1.0 V would be subtracted from 1.4 V to provide 400 mV. This is compared in the comparator circuit 206 to a desired output differential voltage (input 270) (in this case 400 mV). If the differential voltage from the subtraction circuit 204 changes relative to 400 mV, a resultant change appears on output 272 from the comparator circuit 206 (signal V_CONTROL).

The output 272 is thus used as feedback to compensate for variations in the difference of the two output signals 260, 262. In this embodiment, the output 272 is fed into the gate of PMOS transistor 280, which acts as a current source to supply constant current to the driver/follower 200. It will be appreciated that the gate voltage of transistor 280 only changes when the environment or process changes. The voltage across the constant resistor 230 is, however, kept constant by the peak detectors, the subtraction circuit and the comparator circuit 206. Since transistors exhibit different characteristics at different PVT, this means that in order to maintain a constant current through a transistor, a different source to gate voltage is required. Thus, the gate voltage of transistor 280 moves to keep the output voltage constant.

Figure 3:
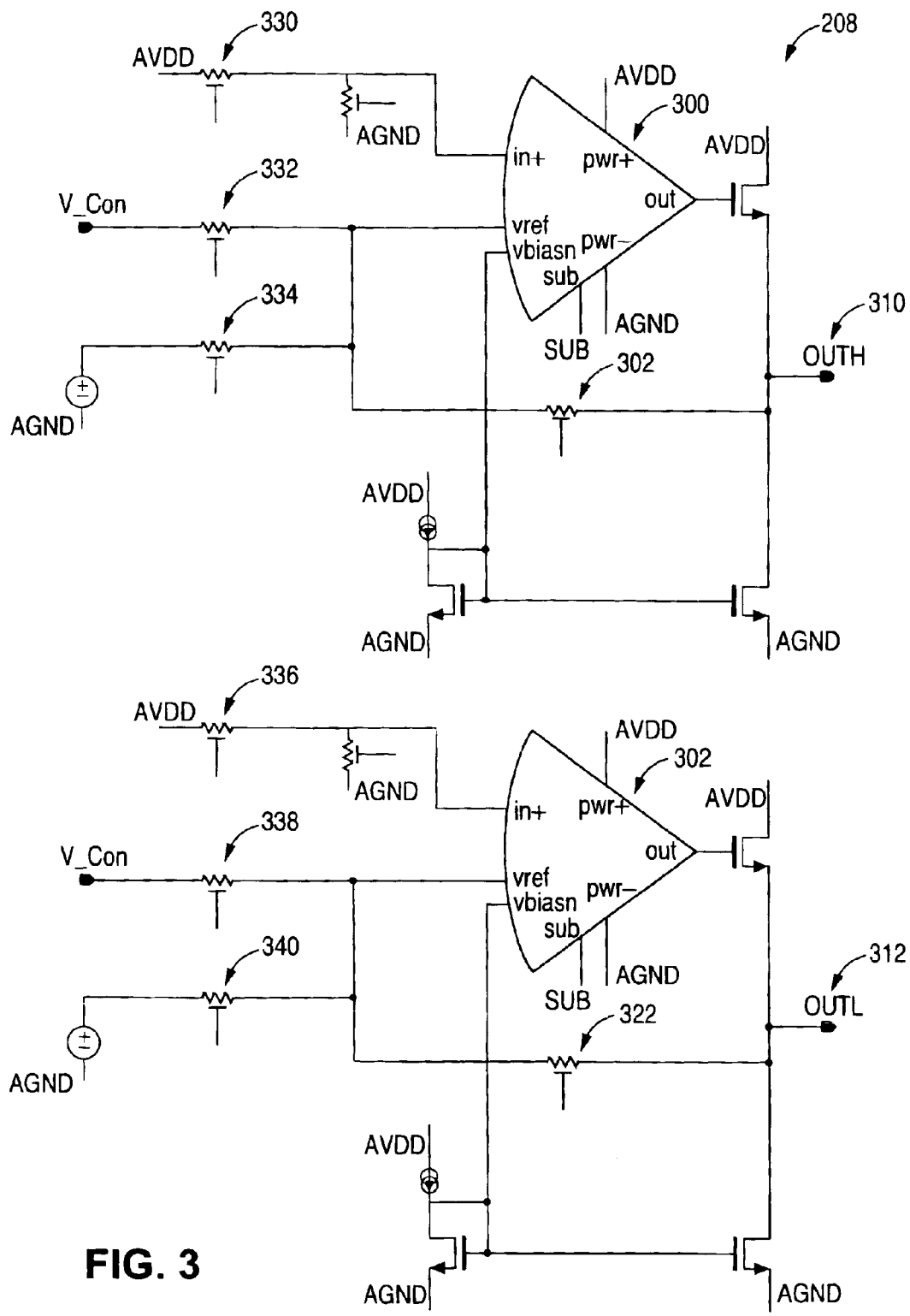
FIG. 3 is a schematic circuit diagram of one embodiment of a pseudo-rail of the invention.

The output 272 is also provided to the pseudo rail 208, one embodiment of which is shown in greater detail in FIG. 3. The pseudo rail 208 comprises two operational amplifiers 300, 302. Operational amplifier 300 provides a high output voltage 310 (OUTH), and operational amplifier 302 provides a low output voltage 312 (OUTL) that is shifted by a predetermined amount relative to OUTH 310. The voltage shift between OUTH and OUTL is dictated by the values of the resistors 320, 322 in the feedback loops. It will, however, be appreciated that the input resistors 330, 332, 334, and 336, 338, 340 could instead be varied to change the outputs from the operational amplifiers 300, 302, respectively.

Referring again to FIG. 2, it can be seen that the outputs OUTH 310, OUTL 312 define voltage levels VCC_UPPER and VCC_LOWER, respectively. As discussed above, VCC_UPPER and VCC_LOWER are used to provide power to the predriver inverters 240, 244, and 242, 246 thereby providing the feedback to adjust for changes in rise/fall time of the differential signal due to PVT.

Figure 4:
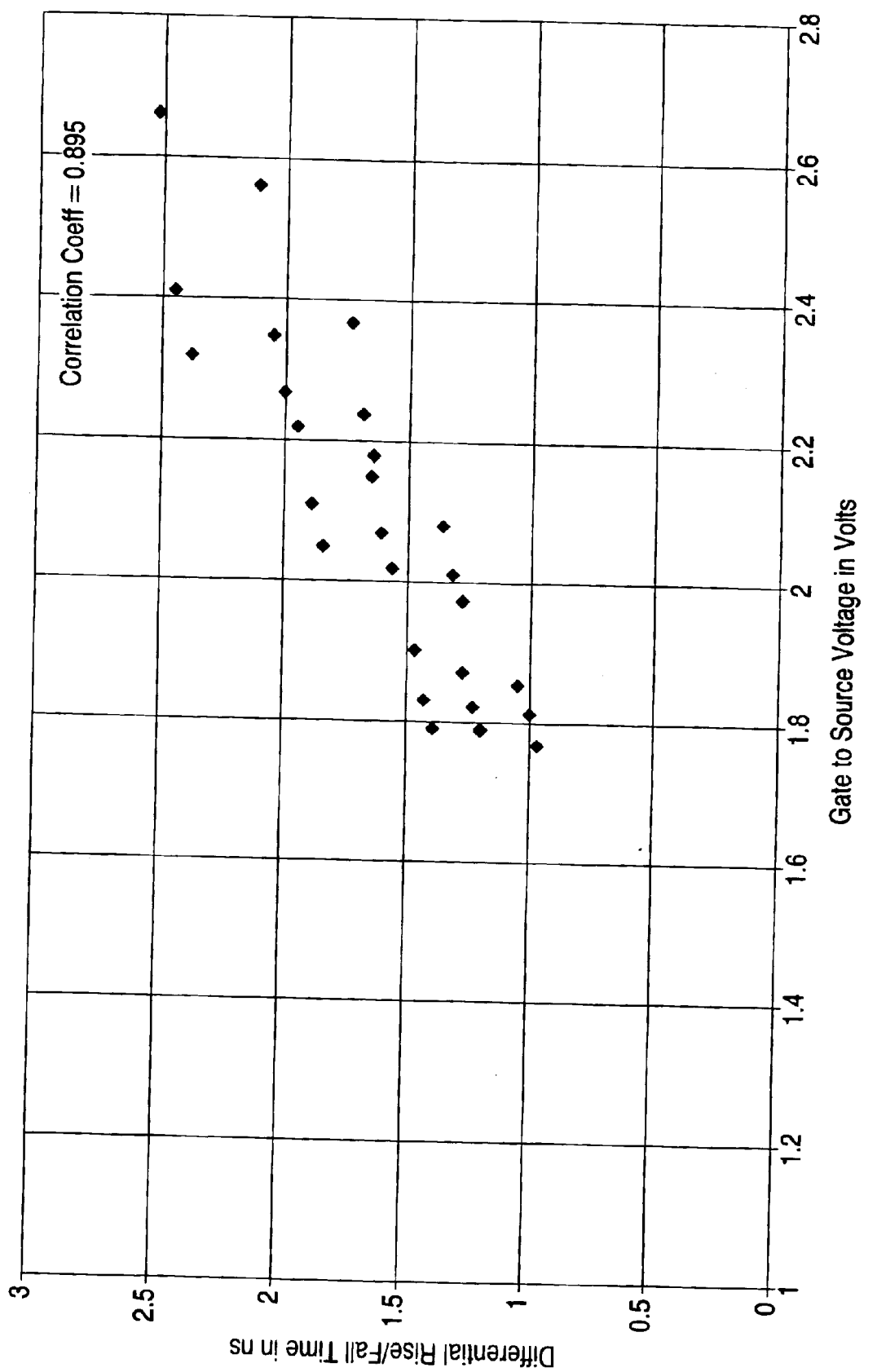
FIG. 4 is a plot of gate to source voltage across a PMOS device used as a current source, plotted against variations in the differential rise/fall time of a LVDS.
Figure 5:
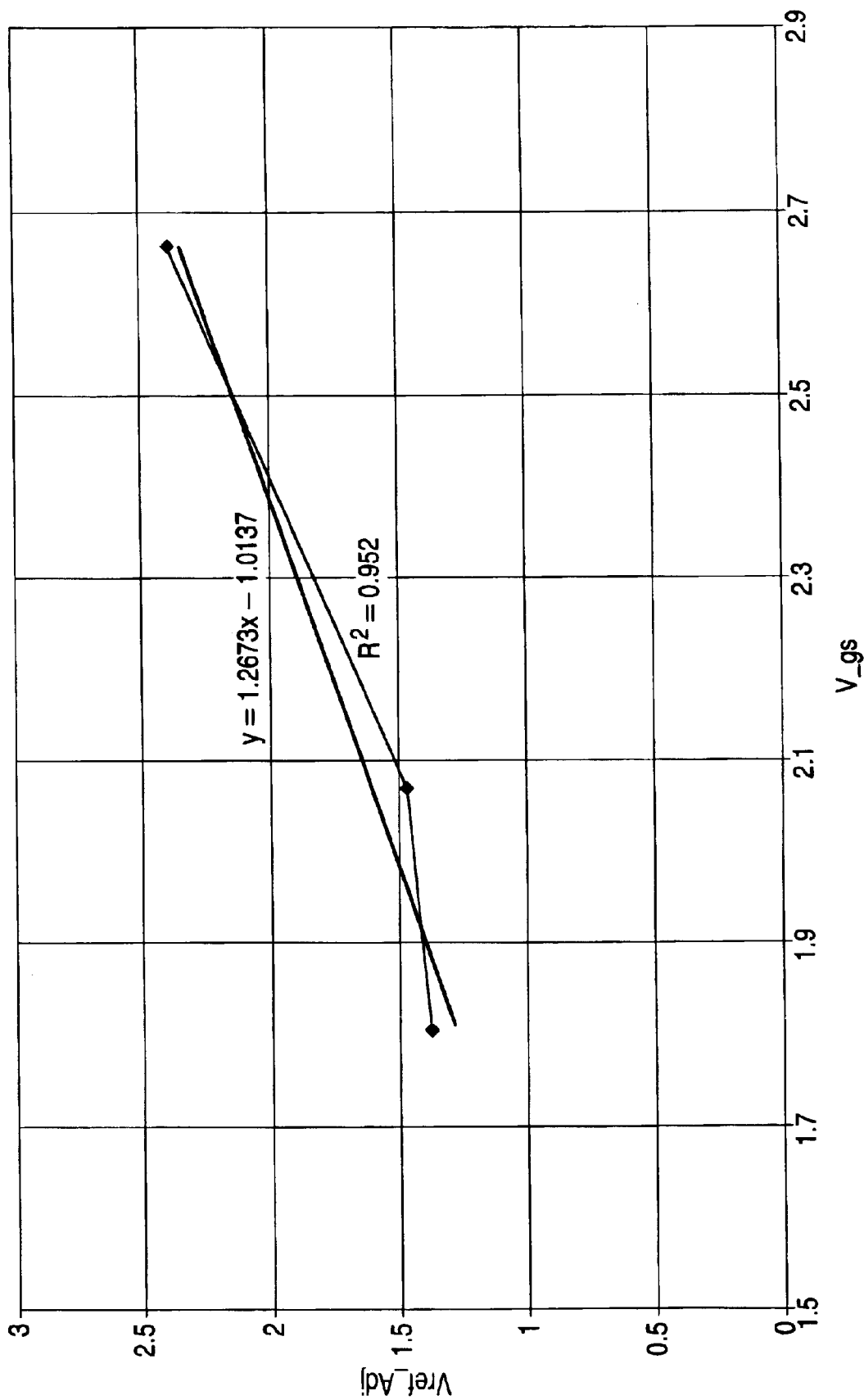
FIG. 5 is a graph of the gate to source voltage against the voltage adjust reference defined by the PMOS gate voltage of the circuit of FIG. 2.

In the embodiment described above, the driver circuit was for a LVDS where the rise/fall time changed linearly with respect to the gate-source voltage of the PMOS transistor 280. This was determined by plotting rise/fall time against the gate-source voltage, as shown in FIG. 4. The resultant plot shows a substantially linear relationship with a correlation coefficient of 0.895. Since the gate-source voltage is related to the V_CONTROL output 272 (which defines the gate voltage on PMOS transistor 280) it was simply a matter of defining a circuit that would provide a corresponding linear relationship. This was achieved by the pseudo rail 208, as shown by the graph of FIG. 5, which shows the linear relationship between Vref_Adj and the gate-source voltage of PMOS transistor 280. The combination of the aforementioned circuits (FIGS. 2 and 3) results in an invention that tightly controls the output edge rate of an LVDS driver, but can be used wherever edge control is necessary where rise/fall time changes are linear. It will be appreciated that other embodiments could compensate for non linear changes by defining a circuit with a corresponding non-linear relationship.

What is claimed is:

1. A method of compensating for rise/fall time variations in the signal from an output driver due to process, voltage or temperature variations, comprising monitoring changes in output voltage from the output driver due to process, voltage or temperature variations, and providing a compensation circuit that supplies a feedback voltage that changes in sympathy with the output voltage change due to rise/fall time variations, wherein the compensation circuit includes a pseudo-rail circuit for generating power supply voltages that change in sympathy with the output voltage change due to rise/fall time variations.

2. A method of claim 1, wherein the changes in output voltage are monitored by monitoring the current flow through a constant resistor.

3. A method of claim 1, wherein the circuit provides a current that changes in sympathy with the output voltage changes, and the current flow is adjusted through a PMOS transistor by controlling gate-source voltage of the PMOS transistor.

4. A method of claim 3, wherein the gate-source voltage of the PMOS transistor is controlled according to a function corresponding to the rise/fall time variation of the output driver circuit signal due to process, voltage or temperature variations.

5. A method of claim 1, wherein providing the compensation circuit includes providing a high and a low peak detector for detecting a high and low voltage peak for the output voltage, feeding the high and low voltage peak into a subtraction circuit to define a voltage differential signal, and providing a comparator to compare the voltage differential signal to a reference voltage.

6. A method of claim 5, wherein the signal being controlled is a low voltage differential signal (LVDS).

7. A method of claim 5, wherein the pseudo rail generates a high and a lower power supply voltage for adjusting the rise and fall time variations, respectively, of the signal from the output driver.

8. A method of claim 7, wherein the high and low power supply voltages supply power to a pre-driver circuit.

9. A method of claim 4, wherein providing the compensation circuit includes providing a high and a low peak detector for detecting a high and low voltage peak for the output voltage, feeding the high and low voltage peak into a subtraction circuit to define a voltage differential signal, and providing a comparator to compare the voltage differential signal to a reference voltage.

10. A method of claim 9, wherein the signal being controlled is a low voltage differential signal (LVDS).

11. A method of claim 9, wherein the pseudo rail generates a high and a low voltage reference for adjusting the rise and fall time variations, respectively, of the signal from the output driver.

12. A method of claim 11, wherein the high and low power supply voltages supply power to a pre-driver circuit.

* * * * *